(12) United States Patent
Xue et al.

(10) Patent No.: US 12,402,535 B2
(45) Date of Patent: Aug. 26, 2025

(54) MAGNETIC TUNNEL JUNCTIONS WITH TUNABLE HIGH PERPENDICULAR MAGNETIC ANISOTROPY

(71) Applicant: Applied Materials, Inc., Santa Clara, CA (US)

(72) Inventors: Lin Xue, San Diego, CA (US); Chi Hong Ching, Santa Clara, CA (US); Xiaodong Wang, San Jose, CA (US); Mahendra Pakala, Santa Clara, CA (US); Rongjun Wang, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 938 days.

(21) Appl. No.: 17/307,783

(22) Filed: May 4, 2021

(65) Prior Publication Data

US 2021/0320247 A1 Oct. 14, 2021

Related U.S. Application Data

(63) Continuation of application No. 16/859,350, filed on Apr. 27, 2020, now Pat. No. 10,998,496, which is a
(Continued)

(51) Int. Cl.
*H10N 50/01* (2023.01)
*G11C 11/16* (2006.01)
(Continued)

(52) U.S. Cl.
CPC .............. *H10N 50/01* (2023.02); *G11C 11/16* (2013.01); *G11C 11/161* (2013.01); *H10B 61/00* (2023.02);
(Continued)

(58) Field of Classification Search
CPC ........ H10N 50/01; H10N 50/10; H10N 50/80; H10N 50/85; H10N 52/00; H10N 52/01;
(Continued)

(56) References Cited

U.S. PATENT DOCUMENTS 4,175,010 A * 11/1979 Koel .................. C25D 5/02
204/192.15
8,609,262 B2 12/2013 Horng et al.
(Continued)

FOREIGN PATENT DOCUMENTS

CN 102986047 A 3/2013
CN 103531707 A 1/2014
(Continued)

OTHER PUBLICATIONS

Office Action for Korean Application No. 10-2020-7030362 dated Dec. 16, 2022.
(Continued)

*Primary Examiner* — Eduardo A Rodela
(74) *Attorney, Agent, or Firm* — Patterson + Sheridan, LLP

(57) ABSTRACT

Embodiments of the disclosure provide methods for forming MTJ structures from a film stack disposed on a substrate for MRAM applications and associated MTJ devices. The methods described herein include forming the film properties of material layers from the film stack to create a film stack with a sufficiently high perpendicular magnetic anisotropy (PMA). An iron containing oxide capping layer is utilized to generate the desirable PMA. By utilizing an iron containing oxide capping layer, thickness of the capping layer can be more finely controlled and reliance on boron at the interface of the magnetic storage layer and the capping layer is reduced.

20 Claims, 3 Drawing Sheets

Related U.S. Application Data continuation of application No. 16/276,128, filed on Feb. 14, 2019, now Pat. No. 10,636,964.

(60) Provisional application No. 62/650,444, filed on Mar. 30, 2018.

(51) Int. Cl.
| | |
|---|---|
| *H10B 61/00* | (2023.01) |
| *H10D 86/40* | (2025.01) |
| *H10D 86/60* | (2025.01) |
| *H10N 50/85* | (2023.01) |
| *G11C 11/18* | (2006.01) |
| *G11C 11/22* | (2006.01) |
| *H10N 50/10* | (2023.01) |
| *H10N 50/80* | (2023.01) |
| *H10N 52/00* | (2023.01) |
| *H10N 52/01* | (2023.01) |
| *H10N 52/80* | (2023.01) |

(52) U.S. Cl.
CPC ........... *H10B 61/10* (2023.02); *H10D 86/421* (2025.01); *H10D 86/60* (2025.01); *H10N 50/85* (2023.02); *G11C 11/18* (2013.01); *G11C 11/22* (2013.01); *H10N 50/10* (2023.02); *H10N 50/80* (2023.02); *H10N 52/00* (2023.02); *H10N 52/01* (2023.02); *H10N 52/101* (2023.02); *H10N 52/80* (2023.02)

(58) Field of Classification Search
CPC ...... H10N 52/101; H10N 52/80; G11C 11/16; G11C 11/161; G11C 11/18; G11C 11/22; H01L 27/1222; H10B 61/00; H10B 61/10
See application file for complete search history.

(56) References Cited

U.S. PATENT DOCUMENTS

| | | | |
|---|---|---|---|
| 8,871,530 B1 | 10/2014 | Hu | |
| 9,337,415 B1 | 5/2016 | Oh et al. | |
| 9,570,671 B2 | 2/2017 | Yoshikawa et al. | |
| 9,748,471 B2 | 8/2017 | Zhou et al. | |
| 9,991,440 B2 | 6/2018 | Wu et al. | |
| 10,255,935 B2 | 4/2019 | Xue et al. | |
| 10,622,011 B2 | 4/2020 | Xue et al. | |
| 10,636,964 B2 | 4/2020 | Xue et al. | |
| 2003/0133232 A1 | 7/2003 | Li et al. | |
| 2004/0101978 A1 | 5/2004 | Linn et al. | |
| 2007/0064352 A1 | 3/2007 | Gill | |
| 2010/0128400 A1 | 5/2010 | Lin | |
| 2011/0014500 A1 | 1/2011 | Horng et al. | |
| 2012/0280339 A1 | 11/2012 | Zhang et al. | |
| 2013/0175644 A1 | 7/2013 | Horng et al. | |
| 2013/0248355 A1* | 9/2013 | Ohsawa ............... H10N 50/80 204/192.34 |
| 2013/0277778 A1 | 10/2013 | Hsu et al. | |
| 2014/0037991 A1 | 2/2014 | Abraham et al. | |
| 2014/0103469 A1 | 4/2014 | Jan et al. | |
| 2014/0145792 A1 | 5/2014 | Wang et al. | |
| 2014/0264663 A1 | 9/2014 | Chen et al. | |
| 2014/0340961 A1 | 11/2014 | Ohno et al. | |
| 2015/0228891 A1 | 8/2015 | Park et al. | |
| 2015/0255135 A1 | 9/2015 | Tran et al. | |
| 2015/0263266 A1* | 9/2015 | Gottwald ............ G11C 11/1673 365/158 |
| 2016/0005955 A1 | 1/2016 | Park et al. | |
| 2016/0042779 A1 | 2/2016 | Wang et al. | |
| 2016/0155931 A1* | 6/2016 | Lee ........................ H10N 50/10 257/421 |
| 2016/0163966 A1 | 6/2016 | Hu et al. | |
| 2016/0380188 A1 | 12/2016 | Hu | |
| 2017/0018706 A1 | 1/2017 | Xue et al. | |
| 2017/0170393 A1 | 6/2017 | Xue et al. | |
| 2019/0288031 A1* | 9/2019 | Satoh .................. H01F 10/3268 |

FOREIGN PATENT DOCUMENTS

| | | |
|---|---|---|
| CN | 103928607 A | 7/2014 |
| CN | 104823292 A | 8/2015 |
| CN | 105990517 A | 10/2016 |
| JP | 2003101100 A | 4/2003 |
| JP | 2004334922 A | 11/2004 |
| JP | 2006190838 A | 7/2006 |
| JP | 2007165572 A | 6/2007 |
| JP | 2012142480 A | 7/2012 |
| JP | 201588669 A | 5/2015 |
| JP | 2016515304 A | 5/2016 |
| JP | 2017532752 A | 11/2017 |
| JP | 201832805 A | 3/2018 |
| KR | 20060046651 A | 5/2006 |
| KR | 20090031994 A | 3/2009 |
| KR | 20140011138 A | 1/2014 |
| KR | 20140099886 A | 8/2014 |
| KR | 20140107143 A | 9/2014 |
| KR | 20170008690 A | 1/2017 |
| TW | 201004006 A | 1/2010 |
| WO | 2013069091 A1 | 5/2013 |

OTHER PUBLICATIONS

Patent Trial and Appeal Board Decision dated Jan. 26, 2024 re KR patent application No. 7030362, with machine translation.
"International Search Report and Written Opinion for International Application No. PCT/US2019/018457 dated May 28, 2019".
Notice of Allowance for U.S. Appl. No. 16/276,128 dated Feb. 25, 2020.
Office Action for Japaneses Application No. 2022-105377 dated Aug. 1, 2023.
Office Action for Japaneses Application No. 2020-552211 dated Nov. 30, 2021.
Extended European Search Report for European Application No. 19775358.5 dated Dec. 2, 2021.
Notice of Preliminary Rejection dtd Sep. 11, 2023 for Korean Patent Application No. 10-2020-7030362.
Taiwan Office Action dated Feb. 13, 2023 for Application No. 108107166.
Office Action for Korean Application No. 10-2020-7030362 dated Jun. 24, 2022.
Korean Office Action dated Apr. 4, 2023 for Application No. 10-2020-7030362.
Chinese Office Action for Application No. 201980020081.2 dated Feb. 21, 2024.
Japanese Office Action for Application No. 2024-024751 dated Feb. 4, 2025.

* cited by examiner

| 255 |
|---|
| 250 |
| 245 |
| 240 |
| 235 |
| 230 |
| 225 |
| 220 |
| 215/215' |
| 210/210' |
| 205/205' |
| 204 |
| 200 |

FIG. 2A

| 255 |
|---|
| 250d |
| 250c |
| 250b |
| 250x |
| 250a |
| 245c |
| 245b |
| 245a |
| 240 |
| 235 |
| 230 |
| 225b |
| 225a |
| 220 |
| 215b |
| 215a |
| 210 |
| 205b, 205c |
| 205a |
| 204 |
| 200 |

FIG. 2B

| 255 |
|---|
| 250d |
| 250c |
| 250b |
| 250x |
| 250a |
| 245c |
| 245b |
| 245a |
| 240 |
| 235 |
| 230 |
| 225b |
| 225a |
| 220 |
| 215b' |
| 215a' |
| 210' |
| 205a' |
| 205b', 205c' |
| 204 |
| 200 |

FIG. 2C

|      |
|------|
| 250d |
| 250c |
| 250b |
| 250x |
| 250a |

FIG. 3A

|      |
|------|
| 250d |
| 250c |
| 250b |
| 250a |

FIG. 3B

|      |
|------|
| 250d |
| 250c |
| 250x |
| 250a |

FIG. 3C

|      |
|------|
| 250x |
| 250a |

FIG. 3D

MAGNETIC TUNNEL JUNCTIONS WITH TUNABLE HIGH PERPENDICULAR MAGNETIC ANISOTROPY

CROSS-REFERENCE TO RELATED APPLICATIONS

This application is a continuation of U.S. patent application Ser. No. 16/859,350, filed on Apr. 27, 2020, which is a continuation of U.S. patent application Ser. No. 16/276,128, filed on Feb. 14, 2019, which claims benefit to U.S. Provisional Patent Application No. 62/650,444, filed on Mar. 30, 2018, all of which are hereby incorporated by reference in their entirety.

FIELD

Embodiments of the present disclosure relate to methods for fabricating structures and devices used in spin-transfer-torque magnetic random access memory (STT-MRAM) applications. More specifically, embodiments of the disclosure relate to methods for fabricating and devices for magnetic tunnel junctions with tunable high perpendicular magnetic anisotropy.

BACKGROUND

Magnetic random access memory (MRAM) is a type of memory device containing an array of MRAM cells that store data using their resistance values instead of electronic charges. Generally, each MRAM cell includes a magnetic tunnel junction (MTJ) structure. The MTJ structure typically includes a stack of magnetic layers having a configuration in which two ferromagnetic layers are separated by a thin non-magnetic dielectric, e.g., an insulating tunneling layer. A top electrode and a bottom electrode are utilized to sandwich the MTJ structure so electric current may flow between the top and the bottom electrode.

One type of MRAM cell is spin-transfer-torque magnetic random access memory (STT-MRAM). In such a fabrication process flow, a stable magnetic tunnel junction (MTJ) stack is utilized to sustain high temperature backend thermal processing while still producing a high tunnel magnetoresistance (TMR) ratio. The MTJ stack often utilizes a buffer layer to improve adhesion and the seeding of the subsequent layers. The MTJ stack also includes a synthetic ferrimagnet (SyF) coupling layer to couple the first pinning layer and the second pinning layer in an antiparallel manner. A capping layer is utilized on top of the MTJ stack which protects the stack from corrosion and also acts as a etch stop layer for hard mask etching. The capping layer, which interfaces with a magnetic storage layer of the MTJ, is utilized to create a sufficient perpendicular magnetic anisotropy (PMA) to provide for a data retention energy barrier.

Conventional capping layers at the interface with the magnetic storage layer utilize boron to maintain a sufficient PMA. However, after high temperature thermal processing, the boron diffuses away from the interface and weakens the magnetic storage layer PMA. Such conventional capping layers utilize a magnesium oxide (MgO) material, however, to maintain a suitable PMA a thicker MgO material is utilized. The thicker MgO material increases surface roughness of the interface and reduces TMR.

Therefore, there is a need in the art for improved methods for fabricating MTJ structures for STT-MRAM applications.

There is also a need for improved MTJ stacks that are able to sustain high temperature thermal processing while preserving high PMA.

SUMMARY

In one embodiment, a magnetic tunnel junction film stack is provided. The film stack includes a buffer layer, a seed layer disposed over the buffer layer, a first pinning layer disposed over the seed layer, and a synthetic ferrimagnet coupling layer disposed over the first pinning layer. A second pinning layer is disposed over the synthetic ferrimagnet coupling layer, a structure blocking layer is disposed over the second pinning layer, a magnetic reference layer is disposed over the structure blocking layer, and a tunnel barrier layer is disposed over the magnetic reference layer. A magnetic storage layer is disposed over the tunnel barrier layer and a capping layer is disposed over the magnetic storage layer. The capping layer comprises an Fe containing oxide material layer.

In another embodiment, a magnetic tunnel junction film stack is provided. The film stack includes a buffer layer, wherein the buffer layer comprises a CoFeB containing layer, a seed layer disposed over the buffer layer, a first pinning layer disposed over the seed layer, and a synthetic ferrimagnet coupling layer disposed over the first pinning layer, wherein the synthetic ferrimagnet coupling layer comprises an Ir containing layer. A second pinning layer is disposed over the synthetic ferrimagnet coupling layer, a structure blocking layer is disposed over the second pinning layer, a magnetic reference layer is disposed over the structure blocking layer, and a tunnel barrier layer is disposed over the magnetic reference layer. A magnetic storage layer is disposed over the tunnel barrier layer, a capping layer is disposed over the magnetic storage layer, the capping layer comprising an Fe containing oxide material layer, and a hard mask is disposed over the capping layer.

In yet another embodiment, a magnetic tunnel junction film stack is provided. The film stack includes a buffer layer, a seed layer disposed on and in contact with the buffer layer, a first pinning layer disposed on and in contact with the seed layer, and a synthetic ferrimagnet coupling layer disposed on and in contact with the first pinning layer. A second pinning layer is disposed on and in contact with the synthetic ferrimagnet coupling layer, a structure blocking layer is disposed on and in contact with the second pinning layer, a magnetic reference layer is disposed on and in contact with the structure blocking layer, and a tunnel barrier layer is disposed on and in contact with the magnetic reference layer. A magnetic storage layer is disposed on and in contact with the tunnel barrier layer, a capping layer is disposed on and in contact with the magnetic storage layer, the capping layer comprising an Fe containing oxide material layer, and a hard mask is disposed on and in contact with the capping layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2A shows a schematic diagram of a portion of a film stack, according to an embodiment described herein.

FIG. 2B shows a schematic diagram of a portion of the film stack, according to an embodiment described herein.

FIG. 2C shows a schematic diagram of a portion of the film stack, according to an embodiment described herein.

FIG. 3A shows a schematic diagram of a capping layer, according to an embodiment described herein.

FIG. 3B shows a schematic diagram of a capping layer, according to an embodiment described herein.

FIG. 3C shows a schematic diagram of a capping layer, according to an embodiment described herein.

FIG. 3D shows a schematic diagram of a capping layer, according to an embodiment described herein.

Figure 1:
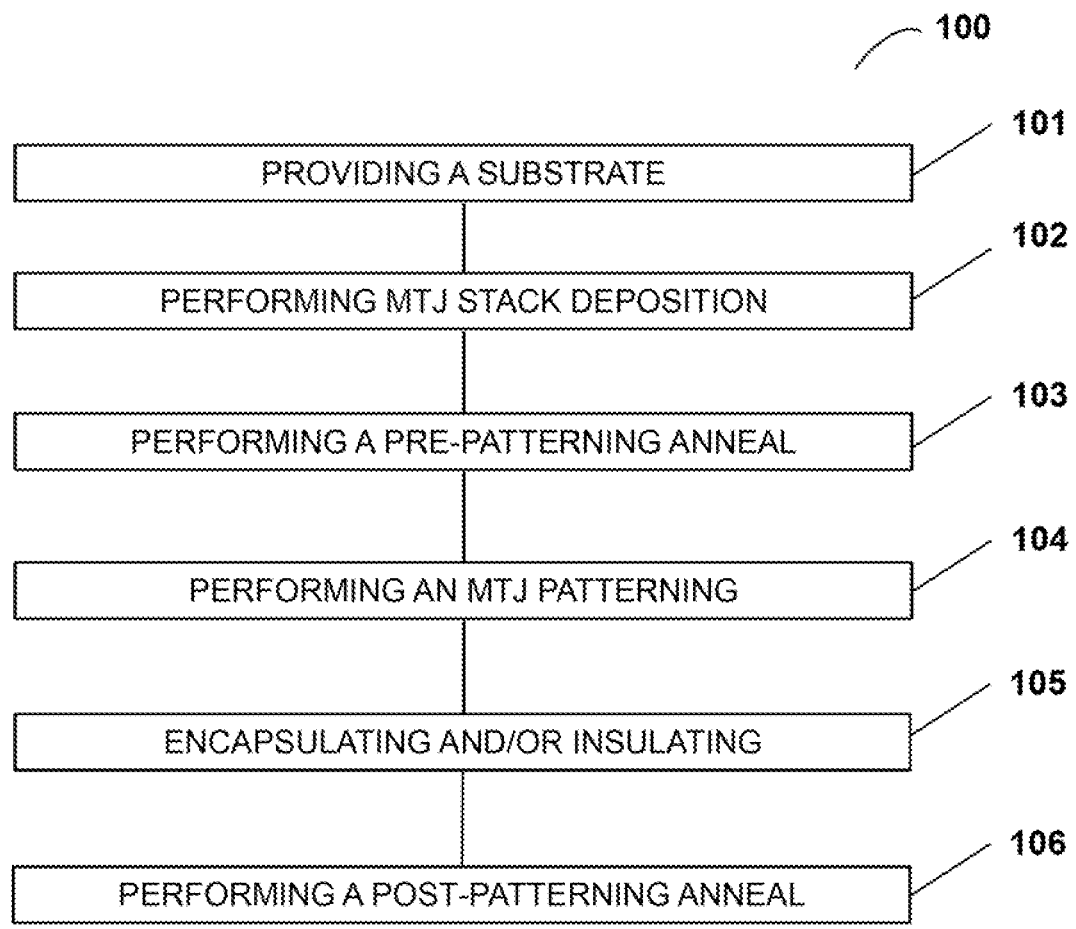
FIG. 1 depicts a flow diagram illustrating a method for fabricating magnetic tunnel junction (MTJ) structures, according to one embodiment described herein.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide methods for forming MTJ structures from a film stack disposed on a substrate for MRAM applications and associated MTJ devices. The methods described herein include forming the film properties of material layers from the film stack to create a film stack with a sufficiently high perpendicular magnetic anisotropy (PMA). An iron containing oxide capping layer is utilized to generate the desirable PMA. By utilizing an iron containing oxide capping layer, thickness of the capping layer can be more finely controlled and reliance on boron at the interface of the magnetic storage layer and the capping layer is reduced.

FIG. 1 depicts a flow diagram illustrating a process 100 for manufacturing MTJ structures on a substrate for MRAM applications according to one embodiment of the present disclosure. In some embodiments, process 100 is a process flow, and operations 101-106 are individual processes. The process 100 is configured to be performed in a plasma processing chamber and a thermal processing chamber or other suitable plasma immersion ion implantation systems or etching chambers. Process 100 may also use other tools such as a PVD chamber, a CVD chamber, and a lithography tool.

The process 100 begins at operation 101 by providing a substrate having a film stack disposed thereon. In some embodiments, the substrate includes metal or glass, silicon, dielectric bulk material and metal alloys or composite glass, crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate may have various dimensions, such as about 200 mm, about 300 mm, about 450 mm or other diameters, as well as, being a rectangular or square panel. Unless otherwise noted, examples described herein are conducted on substrates with a 200 mm diameter, a 300 mm diameter, or a 450 mm diameter substrate. In one embodiment, the substrate includes the film stack disposed on the substrate.

It is noted that pinned magnetic layer(s), optional structure decoupling layer(s), tunnel barrier layer(s), magnetic storage layer(s), magnetic reference layer(s), and capping layer(s) may be formed by any suitable techniques and any suitable manners, such as PVD processes. Examples of systems that may be used to form these layers include ENDURA® PVD system available from Applied Materials Inc., Santa Clara, Calif. It is contemplated that other processing systems, including those available from other manufacturers, may be adapted to practice the disclosure.

Prior to performing MTJ stack deposition at operation 102, other processes may be utilized to form transistor and interconnect layers, known to those of skill in the art. After performing a post-patterning anneal at operation 106, additional operations may be performed, such as operations to complete remaining interconnect layers and contact pads.

At operations 102-104, MTJ stack deposition, pre-patterning anneal, and MTJ patterning is performed. Operations 102-104 include a patterning process, e.g., an etching process, performed to remove a portion of the film stack exposed and defined by an etching mask layer (not shown) from the substrate until the underlying substrate is exposed. The patterning process for patterning the film stack includes several individual operations or different recipes configured to supply different gas mixtures or etchants to etch different layers depending upon the materials included in each layer. During patterning, an etching gas mixture or several gas mixtures with different etching species are sequentially supplied to the substrate surface to remove the portion of the film stack from the substrate. The end point of the patterning process at operation 104 is controlled by time or other suitable methods. For example, the patterning process is terminated after performing the patterning process for between about 200 seconds and about 10 minutes until the substrate is exposed. In another example, the patterning process is terminated by determination from an endpoint detector.

A further deposition process is performed to form an encapsulation and insulation layer on the portion of the substrate where the film stack was removed during the pattering process at operation 104. Encapsulation allows for suitable step coverage and hermeticity, and often includes deposition of a material composed of silicon nitride based materials. Insulation utilizes oxide based materials and includes deposition of a material with a thickness greater than a thickness of an encapsulation material. The insulation layer is formed from suitable insulating materials that are subsequently processed by a series of etching and deposition processes to form interconnect structures (e.g., a backend process) in the insulation layer to complete the device structure fabrication process. In one example, the insulation layer is a silicon oxide layer or other suitable material.

At operation 106, a thermal annealing process is performed. Examples of systems that may be used for annealing include rapid thermal anneal chambers. One example of a rapid thermal anneal chamber is the RADIANCE® chamber available from Applied Materials Inc., Santa Clara, Calif. It is contemplated that other processing system, including those available from other manufacturers, may be adapted to practice the disclosure. The thermal annealing process is performed to repair, densify, and enhance lattice structures of the film stack, particularly the magnetic storage layer(s) and the magnetic reference layer(s) included in the film stack. After the thermal annealing process, the magnetic storage layer(s) and magnetic reference layer(s) are transformed into a crystallized magnetic storage layer(s) and crystallized magnetic reference layer(s) having crystal orientations substantially in a single plane. As desired crystallization of the magnetic storage layer(s) and the magnetic reference layer(s) is obtained, the overall electrical properties of the film stack for manufacturing MTJ devices are improved.

In some embodiments, one of operations 103 and 106 (or any other equivalent anneal process) can be used, depending on the desired implementation. As described below, the MTJ film stacks of the present disclosure are capable of sustaining high temperature thermal processes and improved electrical and magnetic properties.

Each of FIGS. 2A-2C individually show a schematic diagram of a portion of the film stack, according to various embodiments. The film stack includes a substrate 200 and a bottom contact 204. In one embodiment, the bottom contact 204 is patterned. In one embodiment, the bottom contact 204 is disposed on and in contact with the substrate 200. Although not depicted in FIGS. 2A-2C, other layers, such as transistor and interconnect structures, in the form of one or more layers may be disposed between substrate 200 and bottom contact 204. Differences between film stacks illustrated in FIG. 2B and FIG. 2C include the buffer layer 205/205', seed layer 210/210', and first pinning layer 215/215'. In some embodiments, a film stack includes one or more of a bottom contact, a buffer layer, a seed layer, a first pinning layer, a synthetic ferrimagnet (SyF) coupling layer, a second pinning layer, a structure blocking layer, a magnetic reference layer, a tunnel barrier layer, a magnetic storage layer, a capping layer, and a hard mask. In some embodiments, each of these layers individually comprise one or more layers.

In some embodiments, and as shown in FIG. 2A-2C, the film stack utilized to form a magnetic tunnel junction (MTJ) structure is disposed over the bottom contact 204. The MTJ structure includes a buffer layer 205/205' disposed over the bottom contact 204; a seed layer 210/210' disposed over the buffer layer 205/205'; a first pinning layer 215/215' disposed over the seed layer 210/210'; a synthetic ferrimagnet (SyF) coupling layer 220 disposed over the first pinning layer 215/215'; a second pinning layer 225 disposed over the SyF coupling layer 220; a structure blocking layer 230 disposed over the second pinning layer 225; a magnetic reference layer 235 disposed over the structure blocking layer 230; a tunnel barrier layer 240 disposed over the magnetic reference layer 235; a magnetic storage layer 245 disposed over the tunnel barrier layer 240; a capping layer 250 disposed over the magnetic storage layer 245, wherein the capping layer includes one or more layers; and a hard mask 255 disposed over the capping layer 250, wherein at least one of the capping layer, the buffer layer, and the SyF coupling layer is not fabricated from Ru. In one embodiment, when adjacent layers of the film stack are referred to as being disposed over or under an adjacent layer, each of the layers are considered to be disposed on and in contact with each other.

The film stack includes a buffer layer 205/205' disposed over a bottom contact 204. The buffer layer 205/205' is sandwiched between the bottom contact 204 and the seed layer 210/210'. In one embodiment, the buffer layer 205/205' improves adhesion and the seeding of subsequently deposited layers. In one embodiment, buffer layer 205/205' includes one or more layers. In one embodiment, the buffer layer 205/205' is not fabricated from Ru.

In one embodiment, the buffer layer 205/205' includes a CoFeB containing layer 205a/205a'. The weight % (wt %) of boron (B) in the buffer layer 205/205' is between about 10 wt % and about 40 wt %, such as between about 20 wt % and 40 wt %, for example, between about 25 wt % and about 40 wt %. The wt % of iron in the buffer layer 205/205' is between about 20 wt % and about 60 wt %, such as between about 40 wt % and 60 wt %, for example, between about 45 wt % and about 60 wt %. The thickness of the CoFeB containing layer 205a/205a' is between about 0 Å and about 20 Å, such as about 10 Å.

In one embodiment, the buffer layer 205/205' includes a TaN containing layer 205b/205b' and/or a Ta containing layer 205c/205c'. The TaN containing layer 205b/205b' and the Ta containing layer 205c/205c' are disposed over the CoFeB layer 205a in one embodiment. Alternatively, the TaN containing layer 205b/205b' and the Ta containing layer 205c/205c' may be disposed under the CoFeB layer 205a'. The thickness of the TaN containing layer and the Ta containing layer is between about 0 Å and about 40 Å, such as about 15 Å.

The film stack includes a seed layer 210/210' disposed over the buffer layer 205/205'. The seed layer 210/210' is sandwiched between the buffer layer 205/205' and first pinning layer 215/215'.

In some embodiments, the seed layer 210 includes one or more of a Pt containing layer, an Ir containing layer, and a Ru containing layer. A thickness of the seed layer 210 having one or more of Pt containing layer, an Ir containing layer, and a Ru containing layer is between about 0 Å and about 60 Å, such as about 25 Å. In embodiments when the seed layer 210 includes one or more of a Pt containing layer, an Ir containing layer, and a Ru containing layer, the CoFeB containing layer 205a of the buffer layer 205/205' is disposed under the TaN containing layer 205b (and/or Ta containing layer 205c) of the buffer layer 205/205'.

In some embodiments, seed layer 210' includes a NiCr containing layer. The thickness of seed layer 210' having a NiCr containing layer is between about 0 Å and about 100 Å, such as about 50 Å. In embodiments when the seed layer includes a NiCr containing layer, the CoFeB containing layer 205a' of the buffer layer 205/205' is disposed over the TaN containing layer 205b' (and/or Ta containing layer 205c') of the buffer layer 205/205'.

In one embodiment, the film stack includes a first pinning layer 215/215' disposed over seed layer 210/210'. The first pinning layer 215/215' is sandwiched between seed layer 210/210' and SyF coupling layer 220. The first pinning layer 215/215' may comprise one or more layers. The first pinning layer 215/215' is fabricated from several magnetic materials such as a metal alloy with dopants, for example, boron dopants, oxygen dopants, or other suitable materials. Suitable metal alloys include a Ni containing material, a Pt containing material, a Ru containing material, a Co containing material, a Ta containing material, and Pd containing materials. Suitable examples of the magnetic materials include Ru, Ta, Co, Pt, Ni, TaN, NiFeO$_x$, NiFeB, CoFeO$_x$B, CoFeB, CoFe, NiO$_x$B, CoBO$_x$, FeBO$_x$, CoFeNiB, CoPt, CoPd, CoNi, and TaO$_x$.

In one embodiment, the first pinning layer 215 includes a Co containing layer 215b disposed over a Co/Pt containing layer 215a. The thickness of the Co containing layer 215b is between about 0 Å and about 10 Å, such as about 5 Å. The Co/Pt containing layer 215a may have a composition comprising $$[Co_{(x)}/Pt_{(y)}]_m$$

wherein x has a thickness of Co between about 0 Å and about 10 Å, such as between about 0.5 Å and about 7 Å, y has a thickness of Pt between about 0 Å and about 10 Å, such as between about 0.5 Å and about 8 Å, and m is an integer between about 3 and about 10, wherein m represents the number of Co/Pt containing layers 215a repeatedly formed in the film stack. For example, when x is 5 Å, y is 3 Å, and m is integer 2, a Co/Pt layer is comprised of Co layer (5 Å)/Pt layer (3 Å)/Co layer (5 Å)/Pt layer (3 Å).

In one embodiment, the first pinning layer 215' includes a Co containing layer 215b' disposed over a Co/Ni containing layer 215a'. The thickness of the Co containing layer 215b is between about 0 Å and about 10 Å, such as about 5 Å. The Co/Ni containing layer 215a' may have a composition comprising

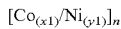

wherein x1 has a thickness of Co between about 0 Å and about 10 Å, such as between about 1 Å and about 8 Å, y1 has a thickness of Ni between about 0 Å and about 10 Å, such as between about 1 Å and about 8 Å, and n is an integer between about 1 and about 10, where n represents the number of Co/Ni containing layers 215a' repeatedly formed in the film stack.

In embodiments when the first pinning layer 215 includes Co/Pt containing layer 215a, the seed layer 210 includes one or more of a Pt containing layer, an Ir containing layer, and a Ru containing layer. In embodiments when the first pinning layer 215' includes a Co/Ni containing layer 215a', the seed layer 210 includes a NiCr containing layer.

The film stack includes a synthetic ferrimagnet (SyF) coupling layer 220 disposed over the first pinning layer 215/215'. In one embodiment, the SyF coupling layer 220 is sandwiched between first pinning layer 215/215' and second pinning layer 225. The SyF coupling layer 220 is used to couple the first pinning layer 215/215' and the second pinning layer 225 in an antiparallel manner. In one embodiment, the SyF coupling layer 220 includes one or more of an Ir containing layer, a Ru containing layer, a Rh containing layer, and a Cr containing layer. In one embodiment, the SyF coupling layer is an Ir containing layer. In another embodiment, the SyF coupling layer is not fabricated from Ru. The thickness of SyF coupling layer 220 is between about 3 Å and about 10 Å. When the SyF coupling layer 220 is a Ru containing layer, the thickness of the SyF coupling layer 220 is between about 4 Å and about 5 Å or between about 7 Å and about 9 Å. When the SyF coupling layer 220 is an Ir containing layer, the thickness of the SyF coupling layer 220 is between about 4 Å and about 6 Å.

The film stack includes a second pinning layer 225 disposed over the SyF coupling layer 220. In one embodiment, the second pinning layer 225 is sandwiched between the SyF coupling layer 220 and a structure blocking layer 230. In one embodiment, the second pinning layer 225 includes one or more layers. The second pinning layer 225 is fabricated from several magnetic materials such as a metal alloy with dopants, for example, boron dopants, oxygen dopants, or other suitable materials. Suitable metal alloys include a Ni containing material, a Pt containing material, a Ru containing material, a Co containing material, a Ta containing material, and Pd containing materials. Suitable examples of the magnetic materials include Ru, Ta, Co, Pt, Ni, TaN, NiFeO$_x$, NiFeB, CoFeO$_x$B, CoFeB, CoFe, NiO$_x$B, CoBO$_x$, FeBO$_x$, CoFeNiB, CoPt, CoPd, CoNi, and TaO$_x$.

In one embodiment, the second pinning layer 225 includes a Co containing layer 225b disposed over a Co/Pt containing layer 215a. The thickness of the Co containing layer 225b is between about 0 Å and about 10 Å, such as about 5 Å. The Co/Pt containing layer 215a may have a composition comprising

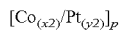

wherein x2 has a thickness of Co between about 0 Å and about 10 Å, such as between about 0.5 Å and about 7 Å, y2 has a thickness of Pt between about 0 Å and about 10 Å, such as between about 0.5 Å and about 8 Å, and p is an integer between about 0 and about 5, where p represents the number of Co/Pt containing layers 225a repeatedly formed in the film stack.

The film stack includes the structure blocking layer 230 disposed over the second pinning layer 225. In one embodiment, the structure blocking layer 230 is sandwiched between the second pinning layer 225 and the magnetic reference layer 235. In one embodiment, the structure blocking layer 230 includes one or more layers. In one embodiment, the structure blocking layer 230 includes one or more of a metal containing material or a magnetic material, such as Mo, Ta, W, CoFe, and CoFeB, one or more of a Ta containing layer, a Mo containing layer, and a W containing layer. A thickness of the second pinning layer 225 is between about 0 Å and about 8 Å, such as about 4 Å.

The film stack includes a magnetic reference layer 235 disposed over the structure blocking layer 230. In one embodiment, the magnetic reference layer 235 is sandwiched between the structure blocking layer 230 and a tunnel barrier layer 240. In one embodiment, the magnetic reference layer 235 comprises one or more layers. The magnetic reference layer 235 if fabricated from several magnetic materials such as a metal alloy with dopants, for example, boron dopants, oxygen dopants, or other suitable materials. Suitable metal alloys include a Ni containing material, a Pt containing material, a Ru containing material, a Co containing material, a Ta containing material, and Pd containing materials. Suitable examples of the magnetic materials include Ru, Ta, Co, Pt, Ni, TaN, NiFeO$_x$, NiFeB, CoFeO$_x$B, CoFeB, CoFe, NiO$_x$B, CoBO$_x$, FeBO$_x$, CoFeNiB, CoPt, CoPd, CoNi, and TaO$_x$.

In one embodiment, one or more of the layers of the magnetic reference layer 235 includes a CoFeB containing layer. The weight % (wt %) of boron (B) in the magnetic reference layer 235 is between about 10 wt % and about 40 wt %, such as between about 20 wt % and 40 wt %, for example, between about 25 wt % and about 40 wt %. The wt % of iron in the magnetic reference layer 235 is between about 20 wt % and about 60 wt %, such as between about 40 wt % and 60 wt %, for example, between about 45 wt % and about 60 wt %. The thickness of the magnetic reference layer 235 is between about 5 Å and about 20 Å, such as about 10 Å.

In one embodiment, the film stack includes the tunnel barrier layer 240 disposed over the magnetic reference layer 235. In embodiment, the tunnel barrier layer 240 is sandwiched between the magnetic reference layer 235 and a magnetic storage layer 245. In one embodiment, the tunnel barrier layer 240 is an oxide barrier layer. In this embodiment, the tunnel barrier layer 240 includes MgO, HfO$_2$, TiO$_2$, TaO$_x$, Al$_2$O$_3$, or other suitable materials. In one embodiment, the tunnel barrier layer 240 is MgO having a thickness of between about 1 Å and about 15 Å, such as about 10 Å. The tunnel barrier layer 240 may be annealed either during or post deposition, for example, using a rapid thermal anneal (RTP) process.

In one embodiment, the film stack includes the magnetic storage layer 245 disposed over the tunnel barrier layer 240.

In one embodiment, the magnetic storage layer 245 is sandwiched between the tunnel barrier layer 240 and a capping layer 250. The magnetic storage layer 245 fabricated from several magnetic materials such as a metal alloy with dopants, for example, boron dopants, oxygen dopants, or other suitable materials. Suitable metal alloys include a Ni containing material, a Pt containing material, a Ru containing material, a Co containing material, a Ta containing material, and/or Pd containing materials. Suitable examples of the magnetic materials include Ru, Ta, Co, Pt, Ni, TaN, NiFeO$_x$, NiFeB, CoFeO$_x$B, CoFeB, CoFe, NiO$_x$B, CoBO$_x$, FeBO$_x$, CoFeNiB, CoPt, CoPd, CoNi, and TaO$_x$.

In one embodiment, the magnetic storage layer 245 is a CoFeB containing material, a CoFeNiB containing material, a Ta containing material, a Mo containing material, or a W containing material, combinations thereof, or other suitable layer(s). For example, in the embodiment depicted in FIG. 2, the magnetic storage layer 245 includes a first CoFeB containing layer 245a and a second CoFeB containing layer 245c sandwiching an intermediate layer 245b. The first CoFeB containing layer 245a has a thickness of about 5 Å to about 20 Å, such as about 10 Å. The weight % (wt %) of boron (B) in the first CoFeB containing layer 245a is between about 10 wt % and about 40 wt %, such as between about 20 wt % and 40 wt %, for example, between about 25 wt % and about 40 wt %. The wt % of iron in the first CoFeB containing layer 245a is between about 20 wt % and about 60 wt %, such as between about 40 wt % and 60 wt %, for example, between about 45 wt % and about 60 wt %.

The second CoFeB containing layer 245c has a thickness of about 5 Å to about 20 Å, such as about 10 Å. The weight % (wt %) of boron (B) in the second CoFeB containing layer 245c is between about 10 wt % and about 40 wt %, such as between about 20 wt % and 40 wt %, for example between about 25 wt % and about 40 wt %. The wt % of iron in the second CoFeB containing layer 245a is between about 20 wt % and about 60 wt %, such as between about 40 wt % and 60 wt %, for example between about 45 wt % and about 60 wt %.

The intermediate layer 245b of the magnetic storage layer 245 includes one or more layers of at least one or more of a Ta containing layer, a Mo containing layer, and a W containing layer. The intermediate layer 245b has a thickness of about 0 Å to about 8 Å, for example about 3 Å.

The film stack includes a capping layer 250 disposed over the magnetic storage layer 245. In one embodiment, the capping layer 250 is sandwiched between the magnetic storage layer 245 and a hard mask 255. The capping layer 250 is utilized on top of the MTJ stack to protect the stack from corrosion and also acts as a etch stop layer for hard mask etching. In one embodiment, the capping layer 250 includes a single layer. In another embodiment, the capping layer 250 is formed from a plurality of layers. In this embodiment, the capping layer 250 includes a first layer 250a, a second layer 250b, a third layer 250c, and a fourth layer 250d.

The first layer 250a includes one or more layers of an oxygen containing layers, such an Fe containing oxide material. In one embodiment, the oxygen containing layer is one or more of a Fe oxide material, a CoFe oxide material, a CoFeB oxide material, a NiFe oxide material, an FeB oxide material, and combinations thereof. The first layer 250a has a thickness of between about 0 Å to about 15 Å, for example between about 2 Å and about 10 Å.

In one embodiment, the first layer 250a is fabricated by sputtering (i.e. a PVD deposition process) an Fe containing metal on the magnetic storage layer 245. In this embodiment, the Fe containing metal is subsequently oxidized in an oxygen containing ambient environment. The oxygen containing ambient environment may be formed in a process chamber or the Fe containing metal may be exposed to atmosphere to form the Fe containing oxide material. In another embodiment, an Fe containing metal is reactively sputtered on the magnetic storage layer 245 in the presence of an oxygen containing gas to form the Fe containing oxide material. In this embodiment, an oxygen containing gas is delivered to a process environment at a flow rate of between about 1 sccm and about 60 sccm, such as between about 10 sccm and about 30 sccm, for example, about 20 sccm.

A time period of oxygen exposure to facilitate oxidation of the Fe material is between about 1 second and about 180 seconds, for example, between about 5 seconds and about 60 seconds. In one example, the Fe containing metal is exposed to the oxygen containing environment (either atmosphere or the oxygen containing gas) for a time period of about 10 seconds, which results in the film stack exhibiting a coercive field (Hc) of about 581 Oe and a data retention barrier (Eb) of about 41 kT. In another example, the Fe containing metal is exposed to the oxygen containing environment (either atmosphere or the oxygen containing gas) for a time period of about 30 seconds, which results in the film stack exhibiting a coercive field (Hc) of about 918 Oe and a data retention barrier (Eb) of about 45 kT. In another example, the Fe containing metal is exposed to the oxygen containing environment (either atmosphere or the oxygen containing gas) for a time period of about 60 seconds, which results in the film stack exhibiting a coercive field (Hc) of about 1029 Oe and a data retention barrier (Eb) of about 51 kT.

In yet another embodiment, an Fe containing oxide material is directly sputtered on the magnetic storage layer 245 to form the Fe containing oxide material. In one or more of the aforementioned embodiments, oxidation of the Fe metal is performed in-situ to avoid subsequent atmospheric exposure and formation of a native Fe oxide.

Utilization of an Fe containing oxide material for the capping layer 250a, which directly interfaces with the magnetic storage layer 245, enables realization of several benefits. The Fe containing oxide material has a bulk PMA which is stronger than conventional capping layer materials which increases the PMA of the MTJ. Moreover, due to the increased PMA, the reliance on boron at the interface between the capping layer 250a and the magnetic storage layer 245 is reduced, and in certain embodiments, substantially eliminated, a boron typically diffuses away from the interface during thermal treatment of the MTJ. In addition, the PMA can be tuned by controlling the thickness of the Fe containing oxide material. Thus, sufficiently thin layers of the Fe containing oxide material, which provide for suitable PMA, can be utilized while avoiding an undesirable increase in film surface roughness and while avoiding influence on TMR of the MTJ. As a result, MTJ performance, such as electrical performance, material stability, tunability, and manufacturability, are improved.

The second layer 250b includes one or more layers of a Ru containing layer and/or an Ir containing layer. The second layer 250b has a thickness of between about 0 Å to about 30 Å, for example about 20 Å. The third layer 250c includes one or more layers of a Ta containing material. The third layer 250c has a thickness of between about 0 Å to about 30 Å, for example about 10 Å. The fourth layer 250d includes one or more of an Ir containing layer and a Ru containing layer, for example, one or more of an Ir containing layer. The fourth layer 250d has a thickness of between about 0 Å to about 50 Å, such as about 30 Å.

In one embodiment, the capping layer 250 includes an optional layer 250x. The optional layer 250x is disposed between the first layer 250a and the second layer 250b. In one embodiment, the optional layer 250x includes one or more layers of a Ir containing layer and/or a Ru containing layer. In another embodiment, the optional layer 250x is an Fe containing oxide material, such as those described above. The optional layer 250x has a thickness of between about 0 Å to about 30 Å, for example about 20 Å.

In embodiments when the capping layer 250 includes optional layer 250x, the second layer 250b is not used. In such an embodiment, the optional layer 250x is above the first layer 250a. In one embodiment, the optional layer 250x is disposed directly on and in contact with the first layer 250a.

FIGS. 3A-3D illustrates various embodiments of the capping layer 250 as discussed above. FIG. 3A illustrates the capping layer 250 which includes the first layer 250a; the optional layer 250x disposed above the first layer 250a; the second layer 250b disposed above the optional layer 250x; the third layer 250c disposed above the second layer 250b; and the fourth layer 250d disposed above the third layer 250c. Materials, compositions, and thickness ranges for each of the layers 250a, 250x, 250b, 250c, 250d are discussed above.

FIG. 3B illustrates the capping layer 250 which includes the first layer 250a; the second layer 250b disposed above the first layer 250a; a third layer 250c disposed above the second layer 250b; and the fourth layer 250d disposed above the third layer 250c. Materials, compositions, and thickness ranges for each of the layers 250a, 250b, 250c, 250d are discussed above.

FIG. 3C illustrates the capping layer 250 which includes the first layer 250a; the optional layer 250x disposed above the first layer 250a; the third layer 250c disposed above the optional layer 250x; and the fourth layer 250d disposed above the third layer 250c. Materials, compositions, and thickness ranges for each of the layers 250a, 250x, 250c, 250d are discussed above.

FIG. 3D illustrates the capping layer 250 which includes the first layer 250a and the optional layer 250x disposed above the first layer 250a. Materials, compositions, and thickness ranges for each of the layers 250a, 250x are discussed above.

FIGS. 2A-2C illustrate exemplary MTJ film stacks wherein one or more of the buffer layer, the SyF coupling layer, and the capping layer is not fabricated from Ru. In some embodiments, the MTJ film stack includes a CoFeB based buffer layer 205/205', which optionally may contain some TaN and/or Ta. The CoFeB layer may be disposed over or under a layer containing TaN and/or Ta. The wt % of boron of the CoFeB based buffer layer should be greater than about 10 wt %, for example, greater than about 25 wt %. In some embodiments, Ir, Ru, Rh, and/or Cr may be used as a SyF coupling layer 220. In some embodiments, Ir and/or Ru may be the top layer metal for a capping layer 250.

Use of a CoFeB based buffer layer in place of a Ru containing buffer layer has demonstrated an increase in the tunnel magnetoresistance (TMR) with excellent magnetic pinning even after annealing at temperatures up to 450° C. High SyF coupling, high perpendicular magnetic anisotropy of pinned layers and reference layer, and controllable perpendicular magnetic anisotropy of free layer are achieved. Some embodiments implementing a CoFeB buffer layer (with boron at 25 wt %) show a TMR (%) improvement of more than 10% from conventional Ta/Ru/Ta buffer layer. The CoFeB layer blocks increased roughness from carrying from the bottom contact into the MTJ film stack.

Additionally, replacing Ru with Ir in the SyF coupling layer and capping layer also has demonstrated an increase in the TMR (%) even after annealing at temperatures up to 450° C. Some embodiments implementing an Ir containing SyF coupling layer show a TMR (%) improvement of more than 10% from conventional Ru containing SyF coupling layer. Moreover, by eliminating Ru in the SyF coupling layer and the capping layer, the film TMR is enhanced by eliminating Ru diffusion towards the MgO. It is likely that the higher thermal stability of $IrO_2$ than $RuO_4$ plays a role in eliminating diffusion.

Configurations such as those of FIGS. 2A-2C provide advantages over conventional film stacks. The first advantage is the buffer stays amorphous even with high temperature thermal process and blocks the texture from the bottom contact. The second advantage is the strong antiparallel coupling between the pinning layers brought by Ir. The third advantage is the TMR improvement by using the new buffer layer and removing Ru from the stack. These advantages lead to higher MTJ performance (such as high TMR, high SyF coupling, high perpendicular magnetic anisotropy of pinned layers and reference layer, and controllable perpendicular magnetic anisotropy of free layer) and improved manufacturability. The MTJ film stack can be used to fabricate memory cells for STT-MRAM application as well as other memory and logic devices that use MTJs as the unit building block. Physical vapor deposition systems (such as ENDURA® STT MRAM) can be used to deposit the MTJ film stack for high performance STT-MRAM chips. As described herein, the MTJ film stack capable of sustaining high temperature thermal process improves both electrical and magnetic properties of the MTJs.

Table 1 and Table 2 show exemplary compositions for film stacks utilized to form a magnetic tunnel junction (MTJ) structure on a substrate. Materials, compositions, and thicknesses for hard mask layer and bottom contact layer are known to persons of ordinary skill in the art.

An additional (and optional) Ir and/or Ru layer within the capping layer, as described above (represented by 250x), may be placed on top of the oxygen containing layer. The thickness of this layer may be between about 0 Å to about 30 Å. In some embodiments, the CoFeB layer of the capping layer is not used when the additional Ir and/or Ru layer is used.

TABLE 1

| Layer | Material | Composition | Thickness (Å) |
|---|---|---|---|
| Hard mask | — | — | — |
| Capping layer | Ir and/or Ru | — | 0-50 |
| | Ta | — | 0-30 |
| | CoFeB | B:10-40%, Fe:20-60% | 0-50 |
| | Ir and/or Ru | — | 0-30 |
| | Fe oxide | — | 2-10 |
| Magnetic storage layer | CoFeB | B:10-40%, Fe:20-60% | 5-20 |
| | Ta, Mo, and/or W | — | 0-8 |
| | CoFeB | B:10-40%, Fe:20-60% | 5-20 |
| Tunnel barrier layer | MgO | — | 1-15 |
| Magnetic reference layer | CoFeB | B:10-40%, Fe:20-60% | 5-20 |
| Structure blocking layer | Ta, Mo, and/or W | — | 0-8 |
| Second | Co | — | 0-10 |

TABLE 1-continued

| Layer | Material | Composition | Thickness (Å) |
|---|---|---|---|
| pinning layer | [Co/Pt]$_p$ | p:0-5 | Co:0.5-7; Pt:0.5-8 |
| SyF coupling layer | Ir or Ru | — | 3-10 |
| First pinning layer | Co [Co/Pt]$_m$ | — m:3-10 | 0-10 Co:0.5-7; Pt:0.5-8 |
| Seed layer | Pt, Ir, Ru and/or Cr | | 0-60 |
| Buffer layer | TaN and/or Ta | | 0-40 |
| Bottom contact | CoFeB — | B:10-40%, Fe:20-60% — | 0-20 — |

All values for composition and thickness are listed as approximate ranges.

TABLE 2

| Layer | Material | Composition (wt %) | Thickness (Å) |
|---|---|---|---|
| Capping layer | Ir and/or Ru Ta CoFeB Ir and/or Ru Fe oxide | — — B:10-40%, Fe:20-60% — — | 0-50 0-30 0-50 0-30 2-10 |
| Magnetic storage layer | CoFeB Ta, Mo, and/or W CoFeB | B:10-40%, Fe:20-60% — B:10-40%, Fe:20-60% | 5-20 0-8 5-20 |
| Tunnel barrier layer | MgO | — | 1-15 |
| Magnetic reference layer | CoFeB | B:10-40%, Fe:20-60% | 5-20 |
| Structure blocking layer | Ta, Mo, and/or W | — | 0-8 |
| Second pinning layer | Co [Co/Pt]$_p$ | — p:0-5 | 0-10 Co:0.5-7; Pt:0.5-8 |
| SyF coupling layer | Ir or Ru | — | 3-10 |
| First pinning layer | Co [Co/Pt]$_n$ | — n:1-10 | 0-10 Co: 1-8; Ni: 1-8 |
| Seed layer | NiCr | — | 0-100 |
| Buffer layer | CoFeB TaN and/or Ta | B:10-40%, Fe:20-60% — | 0-20 0-40 |

All values for composition and thickness are listed as approximate ranges.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of fabricating a magnetic tunnel junction film stack, comprising:
    forming a film stack including at least a magnetic storage layer, wherein forming the film stack comprises:
        forming a synthetic ferrimagnet (SyF) coupling layer;
        forming a magnetic reference layer over the SyF coupling layer;
        forming a tunnel barrier layer over the magnetic reference layer; and
        forming the magnetic storage layer over the tunnel barrier layer; and
    forming a first layer of an Fe containing oxide capping layer over the magnetic storage layer, comprising:
        depositing an Fe containing metal over the magnetic storage layer and subsequently oxidizing the Fe containing metal in an oxygen containing environment.

2. The method of claim 1, wherein the first layer of the Fe containing oxide capping layer forms a direct interface with the magnetic storage layer.

3. The method of claim 2, wherein the direct interface formed between the first layer of the Fe containing oxide capping layer and the magnetic storage layer is substantially free of boron.

4. The method of claim 1, wherein forming the film stack comprises:
    forming a buffer layer; and
    forming a seed layer over the buffer layer, wherein the SyF coupling layer is formed over the seed layer.

5. The method of claim 1, wherein the first layer of the Fe containing oxide capping layer comprises one or more of an Fe oxide material, a CoFe oxide material, a CoFeB oxide material, a NiFe oxide material, an FeB oxide material, or combinations thereof.

6. The method of claim 1, wherein the Fe containing oxide capping layer is substantially free of Ru.

7. A method of fabricating a magnetic tunnel junction film stack comprising:
    forming a film stack including at least a magnetic storage layer;
    forming a first layer of an Fe containing oxide capping layer over the magnetic storage layer, comprising depositing an Fe containing metal over the magnetic storage layer and subsequently oxidizing the Fe containing metal in an oxygen containing environment; and
    forming a second layer of the Fe containing oxide capping layer over the first layer, wherein the second layer of the Fe containing oxide capping layer comprises one or more layers of an Ir containing layer.

8. The method of claim 7, further comprising forming a third layer of the Fe containing oxide capping layer over the second layer, wherein the third layer comprises one or more layers of a Ta containing material.

9. The method of claim 8, further comprising forming a fourth layer of the Fe containing oxide capping layer over the third layer, wherein the fourth layer comprises one or more layers of an Ir containing layer.

10. A magnetic tunnel junction (MTJ) film stack, comprising:
    a magnetic storage layer; and
    an Fe containing oxide capping layer disposed over the magnetic storage layer, wherein the Fe containing oxide capping layer is substantially free of Ru, wherein the Fe containing oxide capping layer comprises:
        a first layer including an Fe containing oxide material; and
        a second layer disposed over the first layer, the second layer comprises an Ir containing layer.

11. The MTJ film stack of claim 10, wherein the Fe containing oxide capping layer comprises:
    a first layer including an Fe containing oxide material; and
    a second layer disposed over the first layer.

12. The MTJ film stack of claim 11, wherein the first layer of the Fe containing oxide capping layer comprises one or more of an Fe oxide material, a CoFe oxide material, a CoFeB oxide material, a NiFe oxide material, an FeB oxide material, or combinations thereof.

13. The MTJ film stack of claim 11, wherein the second layer comprises one or more layers of an Ir containing layer.

14. The MTJ film stack of claim 11, wherein the Fe containing oxide capping layer further comprises a third layer disposed over the second layer, wherein the third layer comprises one or more layers of a Ta containing material.

15. The MTJ film stack of claim 14, wherein the Fe containing oxide capping layer further comprises a fourth layer disposed over the third layer, wherein the fourth layer comprises one or more layers of an Ir containing layer.

16. The MTJ film stack of claim 11, further comprising:
a buffer layer;
a seed layer disposed over the buffer layer;
a synthetic ferrimagnet (SyF) coupling layer disposed over the seed layer;
a magnetic reference layer disposed over the SyF coupling layer; and
a tunnel barrier layer disposed over the magnetic reference layer, wherein the magnetic storage layer is disposed over the tunnel barrier layer.

17. The MTJ film stack of claim 11, wherein a thickness of the first layer of the Fe containing oxide capping layer is about 2 Angstroms to about 10 Angstroms.

18. A method of fabricating a magnetic tunnel junction film stack, comprising:
forming a film stack including at least a magnetic storage layer; and
forming a first layer of an Fe containing oxide capping layer over the magnetic storage layer, wherein the first layer of the Fe containing oxide capping layer forms a direct interface with the magnetic storage layer, wherein the direct interface formed between the first layer of the Fe containing oxide capping layer and the magnetic storage layer is substantially free of boron, and wherein the first layer of the Fe containing oxide capping layer comprises one or more of an Fe oxide material, a CoFe oxide material, a CoFeB oxide material, a NiFe oxide material, an FeB oxide material, or combinations thereof, forming the first layer of the containing oxide capping layer comprises:
reactively sputtering the Fe containing metal over the magnetic storage layer in presence of an oxygen containing gas.

19. The method of claim 18, wherein forming the film stack comprises:
forming a buffer layer;
forming a seed layer over the buffer layer;
forming a synthetic ferrimagnet (SyF) coupling layer over the seed layer;
forming a magnetic reference layer over the SyF coupling layer;
forming a tunnel barrier layer over the magnetic reference layer; and
forming the magnetic storage layer over the tunnel barrier layer.

20. The method of claim 18, wherein the Fe containing oxide capping layer is substantially free of Ru.

* * * * *